(12) United States Patent
Tomida

(10) Patent No.: US 9,938,120 B2
(45) Date of Patent: Apr. 10, 2018

(54) TRANSPORT DEVICE

(71) Applicant: Daifuku Co., Ltd., Osaka-shi (JP)

(72) Inventor: Daichi Tomida, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 344 days.

(21) Appl. No.: 14/590,445

(22) Filed: Jan. 6, 2015

(65) Prior Publication Data
US 2015/0197412 A1 Jul. 16, 2015

(30) Foreign Application Priority Data

Jan. 10, 2014 (JP) .................................. 2014-003554

(51) Int. Cl.
*B66C 13/18* (2006.01)
*B66C 13/06* (2006.01)
(Continued)

(52) U.S. Cl.
CPC ................ *B66C 13/18* (2013.01); *B66C 1/28* (2013.01); *B66C 13/06* (2013.01); *H01L 21/67733* (2013.01)

(58) Field of Classification Search
CPC ........... B66C 1/28; B66C 11/12; B66C 13/04; B66C 13/06; B66C 15/00; B66C 15/02; B66C 19/00; B66C 19/002; B66C 19/007; B66C 1/22; B66C 1/223; B66C 1/226; B66C 1/30; B66C 1/32; B66C 1/62; H01L 21/27733; H01L 21/67; H01L 21/677; H01L 21/67703; H01L 21/67706; H01L 21/67733; H01L 21/67736; B25J 15/0253;
(Continued)

(56) References Cited

U.S. PATENT DOCUMENTS 1,957,719 A * 5/1934 Naugle ..................... B66C 1/28
  294/106
5,141,274 A * 8/1992 Hayden .................. B65G 61/00
  294/113

(Continued)

FOREIGN PATENT DOCUMENTS

| JP | 5294447 A | 8/1977 |
| JP | 610283 U | 2/1994 |
| JP | 2010126278 A | 6/2010 |

*Primary Examiner* — Minh Truong
*Assistant Examiner* — Juan J Campos, Jr.
(74) *Attorney, Agent, or Firm* — The Webb Law Firm

(57) ABSTRACT

The distance between a pair of fall prevention members can be adjusted by causing the pair of fall prevention members to be linearly moved in mutually opposite directions along the spaced-apart direction along which the pair of fall prevention members are spaced apart from each other. A distance adjustment actuator portion is configured to be able to adjust the distance between the pair of fall prevention members to any of a distance for retraction greater than a width of a larger transported object in the spaced-apart direction; a distance for the larger transported object which is less than the distance for retraction and which corresponds to the width of the larger transported object in the spaced-apart direction; and a distance for the smaller transported object which is less than the distance for the larger transported object and which corresponds to a width of the smaller transported object in the spaced-apart direction.

7 Claims, 6 Drawing Sheets

(51) Int. Cl.
*B66C 1/28* (2006.01)
*H01L 21/677* (2006.01)

(58) Field of Classification Search
CPC .. B25J 15/026; B25J 15/0266; B25J 15/0273; B25J 15/028; B25J 15/0286; B25J 15/0293
USPC .................... 294/67.33, 207, 119.1; 414/626
See application file for complete search history.

(56) References Cited

U.S. PATENT DOCUMENTS

| | | | |
|---|---|---|---|
| 5,478,181 A * | 12/1995 | Rudolf, III | B66C 19/002 212/199 |
| 7,210,589 B2 * | 5/2007 | Iizuka | B66C 13/06 212/270 |
| 7,464,823 B2 * | 12/2008 | Nakao | B66C 13/06 212/274 |
| 8,490,802 B2 * | 7/2013 | Honda | B66C 11/04 212/330 |
| 8,757,401 B2 * | 6/2014 | Uchino | H01L 21/67733 212/331 |
| 9,362,152 B2 * | 6/2016 | Wada | H01L 21/67733 |
| 2012/0000875 A1 * | 1/2012 | Kawabata | B66C 1/28 212/71 |
| 2016/0133488 A1 * | 5/2016 | Tomida | H01L 21/6773 212/71 |

\* cited by examiner

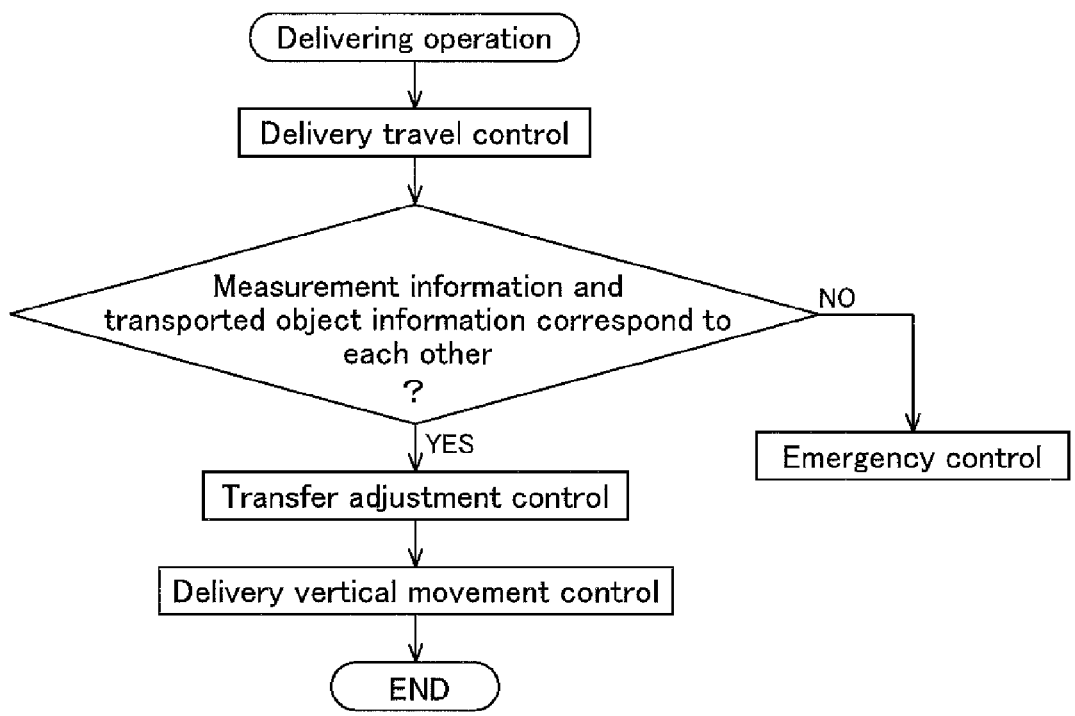

TRANSPORT DEVICE

CROSS-REFERENCE TO RELATED APPLICATION

This application claims priority to Japanese Patent Application No. 2014-003554 filed Jan. 10, 2014, which is hereby incorporated by reference in its entirety.

FIELD OF THE INVENTION

The present invention relates to a transport device comprising a support for suspending and supporting a transported object, a vertically moving portion for vertically moving the support to vertically move the transported object, that is suspended and supported by the support, between a transport position and a transfer position which is lower than the transport position, a pair of fall prevention members spaced apart from each other horizontally at locations below the transported object in the transport position, a distance adjustment actuator portion for adjusting a distance between the pair of fall prevention members in a spaced-apart direction along which the pair of fall prevention members are spaced apart from each other, and a movable member for supporting the support, the vertically moving portion, the pair of fall prevention members, and the distance adjustment actuator portion; and a transport driving member for moving the movable member with the transported object located in the transport position.

BACKGROUND

An example of this type of transport devices is described in JP Publication of Application No. 2010-126278 (Patent Document 1). In the transport device of Patent Document 1, a pair of fall prevention members are moved in mutually opposite directions by pivoting the pivot arms connected to the pair of fall prevention members about vertical axes such that each fall prevention member traces a horizontal arc-shaped trajectory so that the distance between the pair of fall prevention members can be adjusted between a broad distance which is greater than the lateral width of the transported object and a narrow distance which is less than the lateral width of the transported object.

And when vertically moving a support to vertically move the transported object between a transport position and a transfer position, the distance between the pair of fall prevention members is adjusted to the broad distance to allow the transported object to pass between the pair of fall prevention members in the vertical direction, thus allowing the transported object to be vertically moved between the transport position and the transfer position. In addition, when causing a movable member to travel to transport a transported object with the transported object located in the transport position, the distance between the pair of fall prevention members is adjusted to the narrow distance so that, even when the supporting of the transported object by the support fails while transporting the transported object, the transported object is received by the pair of fall prevention members, thus preventing the transported object from falling.

SUMMARY OF THE INVENTION

It is desirable to be able to transport different kinds of transported objects of different sizes (such as a smaller transported object, and a larger transported object having a larger width in a spaced-apart direction than the smaller transported object) using the transport device described above. Thus, if the distance between the pair of fall prevention members is to be set to a distance that corresponds to the lateral width of the transported object when transporting transported objects of different sizes in the spaced-apart direction, then it is necessary to set the distance between the pair of fall prevention members to be smaller when transporting a smaller transported object, compared with the case where a larger transported object is transported. In other words, if one attempts to transport both smaller transported objects and larger transported objects, it is necessary to adjust the distance between the pair of fall prevention members depending on the width of the transported object in the spaced-apart direction.

In the transport device of Patent Document 1, the distance between the pair of fall prevention members is adjusted by moving the pair of fall prevention members in mutually opposite directions such that each fall prevention member traces a horizontal arc-shaped trajectory. However, when configured in this manner, although the distance between the pair of fall prevention members can be adjusted as the pair of fall prevention members are moved in the spaced-apart direction, the pair of fall prevention members also end up moving in the fore and aft direction which is perpendicular to the spaced-apart direction.

In other words, when there is a large difference between the lateral width of the smaller transported object and the lateral width of the larger transported object, it is necessary to have longer pivot arms in order to be able to adjust the distance of the pair of fall prevention members over a broad range to allow the distance of the pair of fall prevention members to be suitable for these transported objects. However, when the length of the pivot arms are made longer, there is a problem that the pair of fall prevention members will project substantially from the movable member, etc., in the fore and aft direction when the distance between the pair of fall prevention members is adjusted from a retraction distance to the narrow distance for the smaller transported object.

With regard to this problem, in order to prevent the pair of fall prevention members which are moved in the fore and aft direction from projecting from the movable member, etc., in the fore and aft direction or to reduce the amount of projection, it is conceivable to shorten the length of the fall prevention members in the fore and aft direction by the same amount that the amount of movement of the pair of fall prevention members in the fore and aft direction is increased; however, if the fall prevention members are made shorter in the fore and aft direction, there is a possibility that the transported object may fall forward or backward from the fall prevention members because of the decreased length of the fall prevention members in the fore and aft direction.

Thus, it would be desirable to provide a transport device in which the length of the pair of fall prevention members can be long in the fore and aft direction while allowing the distance between the pair of fall prevention members to be adjusted over a broad range in the spaced-apart direction.

The transport device in accordance with the present invention comprises: a support for suspending and supporting a transported object; a vertically moving portion for vertically moving the support to vertically move the transported object, that is suspended and supported by the support, between a transport position and a transfer position which is lower than the transport position; a pair of fall prevention members spaced apart from each other horizontally at locations below the transported object in the transport position; a distance adjustment actuator portion for adjusting a distance between the pair of fall prevention members in a spaced-apart direction along which the pair of fall prevention members are spaced apart from each other; a movable member for supporting the support, the vertically moving portion, the pair of fall prevention members, and the distance adjustment actuator portion; a transport driving member for moving the movable member with the transported object located in the transport position; wherein a smaller transported object and a larger transported object having a larger width in the spaced-apart direction than the smaller transported object are provided as the transported object, wherein the pair of fall prevention members are configured such that the distance between the pair of fall prevention members can be adjusted by causing the pair of fall prevention members to be linearly moved in mutually opposite directions along the spaced-apart direction, and wherein the distance adjustment actuator portion is configured to be able to adjust the distance between the pair of fall prevention members to any of a distance for retraction greater than a width of the larger transported object in the spaced-apart direction; a distance for the larger transported object which is less than the distance for retraction and which corresponds to the width of the larger transported object in the spaced-apart direction; and a distance for the smaller transported object which is less than the distance for the larger transported object and which corresponds to a width of the smaller transported object in the spaced-apart direction.

With the arrangement described above, the distance between the pair of fall prevention members can be adjusted by causing the pair of fall prevention members to be linearly moved in mutually opposite directions along the spaced-apart direction along which the pair of fall prevention members are spaced apart from each other. Thus, the positions of the pair of fall prevention members do not change in the fore and aft direction even when the distance between the pair of fall prevention members is adjusted. Thus, the distance between the pair of fall prevention members can be adjusted to any of the distance for retraction, the distance for the larger transported object, and the distance for the smaller transported object, without causing the pair of fall prevention members to move the fore and aft direction.

And because the distance between the pair of fall prevention members can be adjusted without causing the pair of fall prevention members to move along the fore and aft direction, there is no need to shorten the length of the pair of fall prevention members in order to prevent the pair of fall prevention members from projecting from the movable member etc. along the fore and aft direction or to reduce the amount of projection as with the case of the pivot type described above in which the pair of fall prevention members are moved along the fore and aft direction. Thus, the length of the pair of fall prevention members in the fore and aft direction can be made longer compared with those of the pivot type described above.

Thus, the length of the pair of fall prevention members in the fore and aft direction can be made longer while allowing the distance between the pair of fall prevention members to be adjusted over a large range along the spaced-apart direction.

Examples of preferred embodiments of the present invention are described next.

In an embodiment of the transport device in accordance with the present invention, the transport device preferably further comprises: a controller for controlling operation of the distance adjustment actuator portion; and a measurement portion for performing measurement for obtaining information on a width of the transported object in the spaced-apart direction; wherein the controller is preferably configured to control operation of the distance adjustment actuator portion based on the measurement information from the measurement portion to adjust the distance between the pair of fall prevention members from the distance for retraction to the distance for the larger transported object or to the distance for the smaller transported object.

With the arrangement described above, the controller can adjust the distance between the pair of fall prevention members to the distance for the larger transported object or to the distance for the smaller transported object based on the measurement information from the measurement portion. In other words, information about the width of the transported object actually transported by the transport device is obtained through measurement taken by the measurement portion. And to adjust the distance between the pair of fall prevention members based on the obtained information, the distance between the pair of fall prevention members can be adjusted to the distance that corresponds to the width, in the spaced-apart direction, of the transported object actually transported.

In an embodiment of the transport device in accordance with the present invention, the larger transported object is preferably formed to be larger than the smaller transported object in a vertical direction, wherein the measurement portion preferably includes an optical light emitter for emitting detection light along the spaced-apart direction, and a light receiver for receiving the detection light emitted by the light emitter, wherein the light emitter preferably emits the detection light at such a height that the detection light is blocked by the larger transported object in the transport position and that the detection light is not blocked by the smaller transported object in the transport position.

With the arrangement described above, when the transported object located in the transport position is a larger transported object, the detection light emitted by the light emitter is blocked by the larger transported object; thus, the light receiver does not receive the detection light. On the other hand, when the transported object located in the transport position is a smaller transported object, the detection light emitted by the light emitter is not blocked by the smaller transported object; thus, the light receiver receives the detection light.

And because the larger transported object and the smaller transported object are different in size, or dimensions, in both the spaced-apart direction and the vertical direction, it is possible to determine if the width, in the spaced-apart direction, of the transported object is the width of the larger transported object or the width of the smaller transported object based on the detection light receiving state (i.e., whether the detection light is received or not) of the light receiver that changes depending on the vertical size, or dimension, of the transported object.

And if the light emitter and the light receiver are provided such that the light emitter emits detection light in the vertical direction, the light emitter and/or the light receiver would be more likely to get in the way of the transported object as it is moved vertically; thus, it is more difficult to install the light emitter and the light receiver in such a manner. However, by providing the light emitter and the light receiver such that the light emitter emits detection light in the spaced-apart direction, the light emitter and/or the light receiver would be less likely to get in the way of the transported object as it is moved vertically; thus, it becomes easier to install the light emitter and the light receiver in such a manner.

In an embodiment of the transport device in accordance with the present invention, the controller is preferably configured to receive transported object information which indicates a size of the transported object, from an external controller, and is preferably configured to perform a predetermined emergency control if the transported object information does not correspond to the width of the transported object in the spaced-apart direction according to the measurement information from the measurement portion.

With the arrangement described above, a predetermined emergency control is performed if the transported object information from the external controller does not correspond to the width of the transported object in the spaced-apart direction according to the measurement information from the measurement portion. In other words, for example, if the transported object that is actually transported is a smaller transported object despite the fact that a larger transported object should have been transported, the size of the transported object indicated by the transported object information from the external controller would not correspond to the width, in the spaced-apart direction, of the transported object according to the measurement information from the measurement portion. As in such case, if the transported object information from the external controller does not correspond to the width of the transported object in the spaced-apart direction according to the measurement information from the measurement portion, any problem, caused by transporting a transported object that is different from the transported object that should have been transported, can be prevented in advance by performing a predetermined emergency control, such as performing an emergency stop of the transport device or turning on an alarm.

In an embodiment of the transport device in accordance with the present invention, the larger transported object is formed to be larger than the smaller transported object in a vertical direction, wherein each of the pair of fall prevention members is provided with restriction members for restricting movement of the transported object along horizontal directions, wherein an upper end of each of the restriction members is located above a lower end of the smaller transported object in the transport position, and wherein the restriction members include a front side restriction member located on a front side of the transported object in the transport position, along the fore and aft direction which is perpendicular to the spaced-apart direction, a back side restriction member located on a back side, along the fore and aft direction, of the transported object in the transport position, and a lateral side restriction member located outwardly, along the spaced-apart direction, of the transported object in the transport position.

With the arrangement described above, the upper end of each of the front side restriction member, the back side restriction member, and the lateral side restriction member is located above the lower end of the smaller transported object in the transport position. Thus, even if the transported object unintentionally disengages from the support, the transported object would not move onto any of the restriction members and the movement of the transported object to the front, back, and the side can be restricted by in the restriction members; thus, the transported object can be reliably prevented from falling over the fall prevention members.

In an embodiment of the transport device in accordance with the present invention, a moving member is preferably connected to each of the pair of fall prevention members wherein each of the moving members is connected to one end portion, along a fore and aft direction, of corresponding one of the pair of fall prevention members, with the fore and aft direction being perpendicular to the spaced-apart direction, wherein the distance adjustment actuator portion is preferably provided on one side, along the fore and aft direction, in which the moving members are located with respect to the pair of fall prevention members, and is preferably configured to move the moving member connected to one of the pair of fall prevention members and the moving member connected to the other of the pair of fall prevention members, in mutually opposite directions along the spaced-apart direction.

With the arrangement described above, since each moving member is connected to one end portion, along a fore and aft direction, of corresponding one of the pair of fall prevention members, the distance adjustment actuator portion for actuating the moving members can be located next to the fall prevention members along the fore and aft direction. Thus, the transport device can be made smaller in the spaced-apart direction compared to a case where the distance adjustment actuator portion is so located next to the fall prevention member along the spaced-apart direction.

In an embodiment of the transport device in accordance with the present invention, a guided member is preferably connected to each of the pair of fall prevention members wherein each of the guided members is connected to an outward end portion, in the spaced-apart direction, of the corresponding one of the pair of fall prevention members, and wherein there are preferably provided a guide member for guiding, along the spaced-apart direction, the guided member connected to one of the pair of fall prevention members, and a guide member for guiding, along the spaced-apart direction, the guided member connected to the other of the pair of fall prevention members.

With the arrangement described above, since each guided member is connected to the outward end portion, in the spaced-apart direction, of the corresponding one of the pair of fall prevention members, the guide members, which guide the respective guided members along the spaced-apart direction, can be located more outwardly along the spaced-apart direction than otherwise. Thus, when the fall prevention members are retracted to the respective positions for retraction, the guide members would not project inwardly along the spaced-apart direction with respect to the respective fall prevention members, or the amount of the projections can be reduced, making it more unlikely for the guide members to get in the way of the transported object when transferring the object by vertically moving it.

BRIEF DESCRIPTION OF THE DRAWINGS

FIG. 10 is a flow chart for an unloading operation.

DETAILED DESCRIPTION

Figure 1:
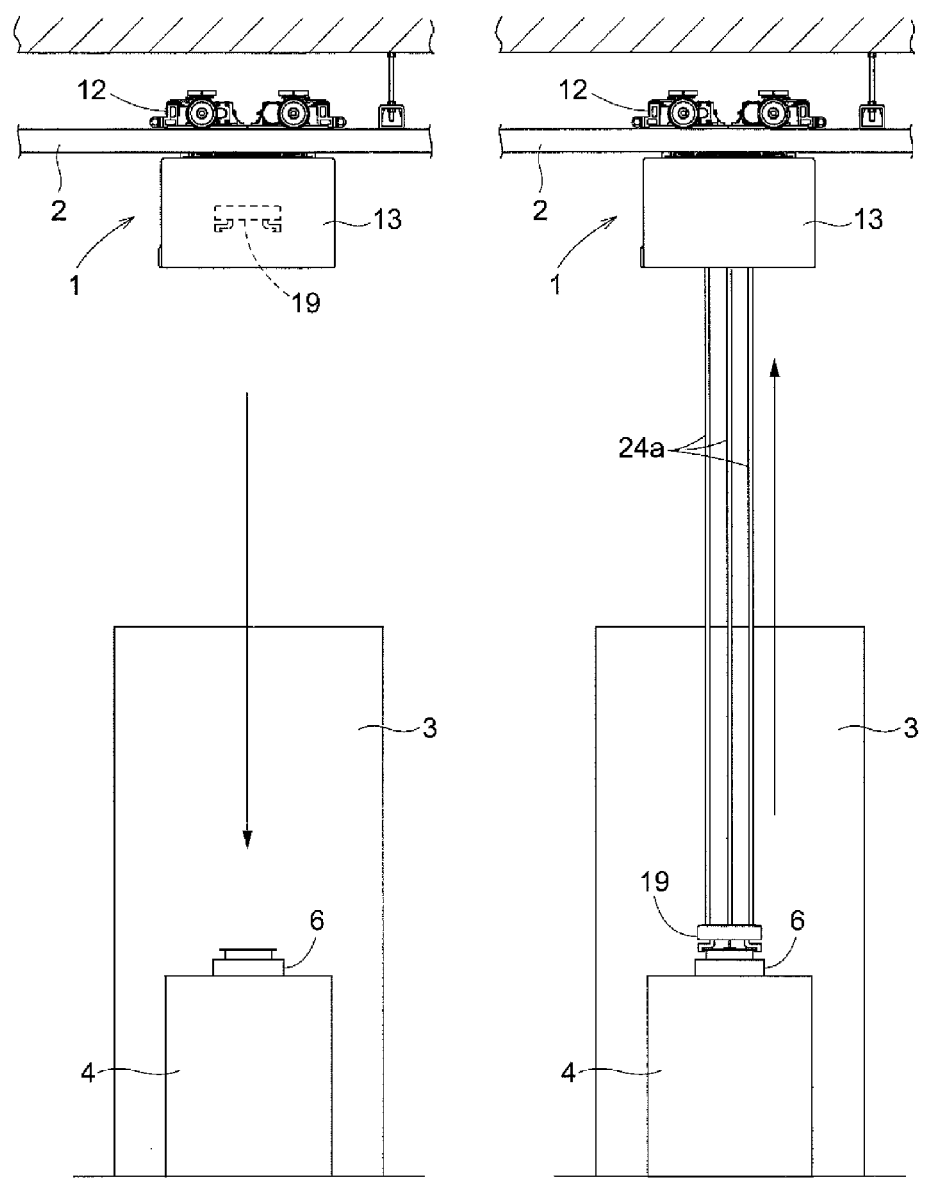
FIG. 1 is a lateral side view of an article transport facility.

Embodiments of the article transport facility equipped with a transport device in accordance with the present invention are described next with reference to the drawings.

As shown in FIGS. 1-4, the article transport facility includes a ceiling, or overhead, transport vehicle 1 which functions as a transport device which can travel along a travel path while guided and supported by travel rails 2 provided along the travel path on the ceiling side, and a processing devices 3 each of which processes transported objects 6 or contents thereof. The ceiling transport vehicle 1 is configured to transport a transported object 6 transported from another location to a support platform 4 provided to each processing device 3, and is also configured to transport a transported object 6 on the support platform 4 to another location. Each processing device 3 is configured to transport the transported object 6 between the top of the support platform 4 and inside of the processing device 3 by means of a transport mechanism, not shown.

The article transport facility is a transport facility in a semiconductor production facility, and transports the transported objects 6 by means of the ceiling transport vehicles 1 in order to transport the transported objects 6 among a plurality of processing steps. In addition, each transported object 6 is a transporting container for storing stored objects, and more specifically, is a pod for storing photomasks as housed or carried objects.

Figure 3:
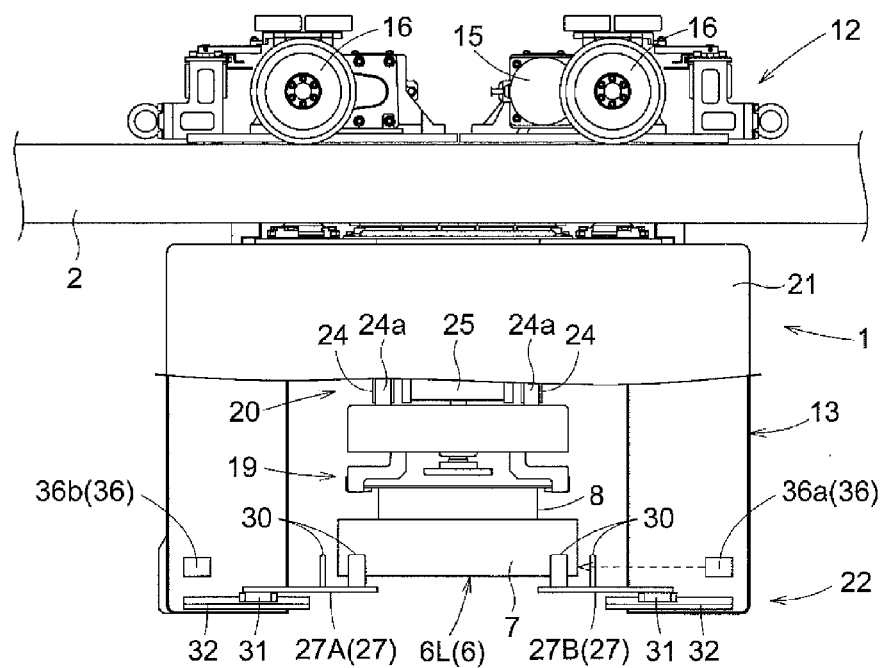
FIG. 3 is a side view of the ceiling transport vehicle in which the distance between the pair of fall prevention members is adjusted to a distance for the larger transported object.
Figure 4:
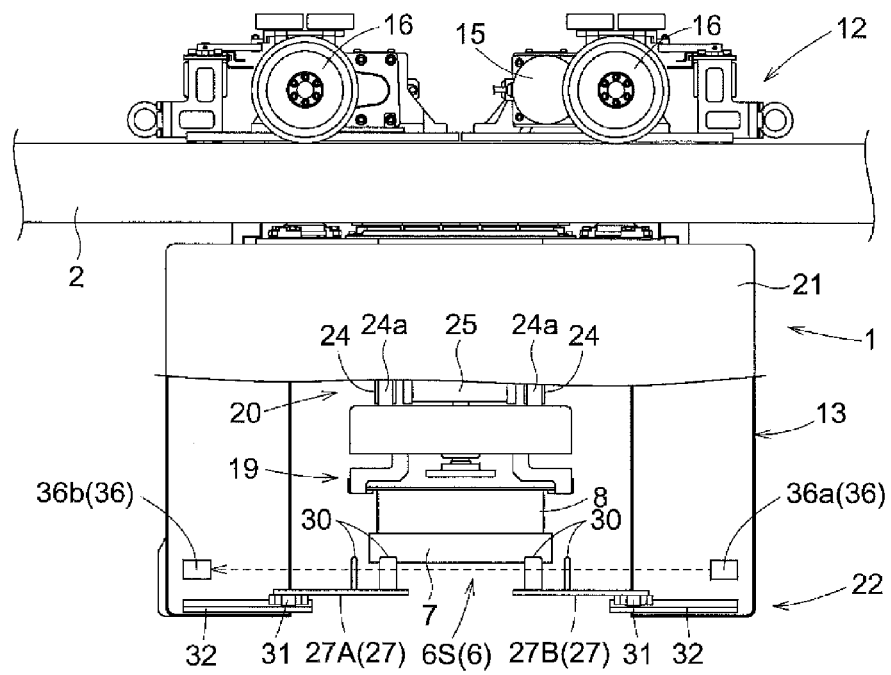
FIG. 4 is a side view of the ceiling transport vehicle in which the distance between the pair of fall prevention members is adjusted to a distance for the smaller transported object.

As shown in FIGS. 3 and 4, the transported object 6 is either a smaller transported object 6S (see FIG. 4) or a larger transported object 6L (see FIG. 3) having a larger volume than the smaller transported object 6S. In the present embodiment, the smaller transported object 6S is a container for storing one or more phase shift masks as photomasks, and the larger transported object 6L is a container for storing one or more extreme ultraviolet (EUV) masks as photomasks. Note that the smaller transported object 6S may be a container for storing a number of semiconductor wafers that are 300 mm in diameter, and that the larger transported object 6L may also be a container for storing a number of semiconductor wafers that are 450 mm in diameter.

Figure 2:
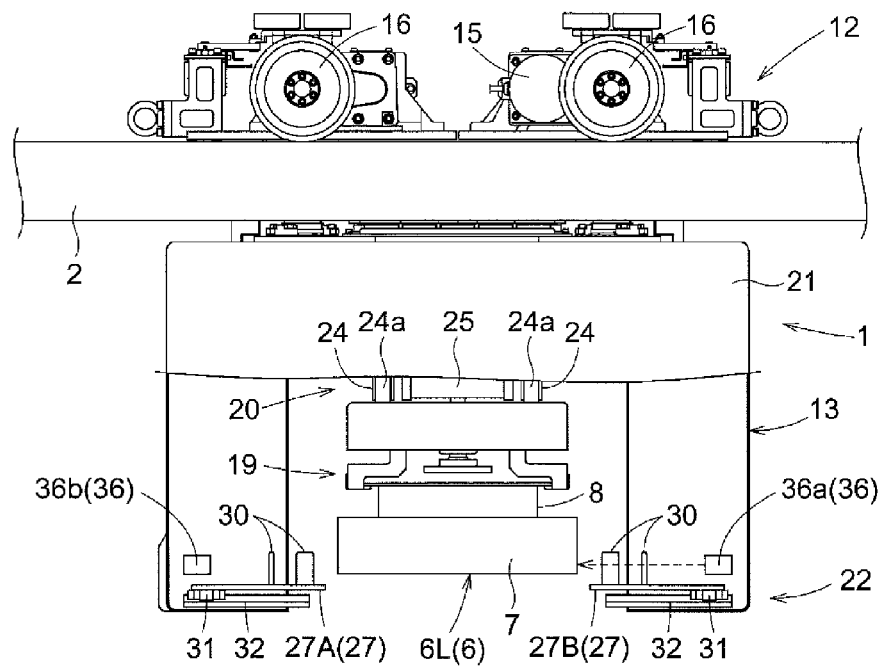
FIG. 2 is a side view of a ceiling transport vehicle in which the distance between the pair of fall prevention members is adjusted to a distance for retraction.

And as shown in FIGS. 2 and 3, each transported object 6 includes a main body portion 7 for storing the stored objects, and a supported member 8 which is connected to the top surface of this main body portion 7, and is thus provided in an upper end portion of the transported object 6.

The larger transported object 6L is formed to be larger than the smaller transported object 6S in the vertical direction, the container lateral direction, and the container fore and aft direction so that the main body portion 7 of the larger transported object 6L is configured to be able to store, or carry, stored objects that are larger than the objects the main body portion 7 of the smaller transported object 6S can store or carry. The supported member 8 of the larger transported object 6L and the supported member 8 of the smaller transported object 6S are formed to have identical dimensions in the container fore and aft direction and the container lateral direction.

Incidentally, FIGS. 1 (a) and (b) show how the ceiling transport vehicle 1 delivers and receives (or loads and unloads) a transported object 6 to or from the support platform 4 of a processing device 3, using the larger transported object 6L as an example. In addition, FIG. 3 shows the ceiling transport vehicle 1 transporting the larger transported object 6L whereas FIG. 4 shows the ceiling transport vehicle 1 transporting the smaller transported object 6S.

[Ceiling Transport Vehicle]

Additional description of the ceiling transport vehicle 1 is provided next. In describing the ceiling transport vehicle 1, the direction along the travel direction of the ceiling transport vehicle 1 (right and left or lateral direction in FIG. 1-FIG. 7) is referred to as the lateral direction while the direction (the vertical direction in FIG. 5-FIG. 7) that intersects this lateral direction at an angle (perpendicular in this example) is referred to as the fore and aft direction. In addition, the transported object 6 is supported by the vertical movement support portion 13 with its container lateral direction oriented along (i.e., parallel to) the lateral direction of the ceiling transport vehicle 1. Thus, the description is given hereinafter with the container lateral (right and left) direction of the transported object 6 being referred to as the lateral direction and the container fore and aft direction of the transported object 6 being referred to as the fore and aft direction.

In addition, one side (left hand side in FIGS. 5-7) along the lateral direction is referred to as the first lateral direction side whereas the side opposite from the first lateral direction side (right hand side in FIG. 5-FIG. 7) along the lateral direction is referred to as the second lateral direction side. In addition, one side (lower side in FIGS. 5-7) along the fore and aft direction is referred to as the first fore and aft direction side whereas the side opposite from the first fore and aft direction side (upper side in FIG. 5-FIG. 7) along the fore and aft direction is referred to as the second fore and aft direction side.

As shown in FIGS. 2-4, the ceiling transport vehicle 1 includes a travel portion 12 configured to travel on the travel rails 2 along a travel path, and a vertical movement support portion 13 suspended and supported by the travel portion 12 such that the vertical movement support portion 13 is located below the travel rails 2. The vertical movement support portion 13 supports a support mechanism 19 which supports the transported object 6 such that the support mechanism 19 can be moved vertically.

The travel portion 12 includes a travel motor 15, drive wheels 16 which are driven and rotated by this travel motor 15 and roll on the top surfaces of the travel rails 2, and rotatable guide wheels (not shown) which are in contact with side faces of the travel rails 2. And the travel portion 12 is configured to allow the ceiling transport vehicle 1 to travel along the travel path while guided by the travel rails 2 by virtue of the fact that the drive wheels 16 are driven and rotated by the travel motor 15 and that the guide wheels are in contact with and thus guided by the travel rails 2.

The vertical movement support portion 13 includes the support mechanism 19 which functions as a support which suspends and supports the transported object 6, a vertically moving mechanism 20 which functions as a vertically moving portion for vertically moving the support mechanism 19, a cover portion 21 which covers an area above, as well as side areas of the periphery of, the transported object 6 located in the transport position, a fall prevention mechanism 22 for preventing the transported object 6 supported to be in the transport position by the support mechanism 19 from falling.

Note that FIGS. 2-4 show the ceiling transport vehicle 1 with some portions of the cover portion 21 broken away. Also, while not shown, the vertical movement support portion 13 includes a positioning mechanism for rotating the vertically moving mechanism 20 about a vertical axis (axis along the vertical direction) and for moving the vertically moving mechanism 20 in the fore and aft direction in order to adjust the attitude and position of the support mechanism 19 relative to the travel portion 12.

The vertically moving mechanism 20 includes a spooling member 24 for spooling spool belts 24*a*, and a vertical movement motor 25 for driving and rotating the spooling member 24. Connected to the distal end portions of the spool belts 24*a* is the support mechanism 19 to support the support mechanism 19. And the support mechanism 19 is vertically moved by virtue of the fact that the spooling member 24 is drivingly rotated in a forward and reverse direction by means of the vertical movement motor 25 to cause the spool belts 24*a* to be spooled and fed out.

As shown in FIGS. 2-4, with the spool belts 24*a* spooled, the transported object 6 (the larger transported object 6L or the smaller transported object 6S), which is supported by the support mechanism 19, is located in the transport position within the cover portion 21. And as shown in FIG. 1 (*b*), with the spool belts 24*a* fed out, the transported object 6 (the larger transported object 6L or the smaller transported object 6S), which is supported by the support mechanism 19, is located in the transfer position, for example, on the support platform 4.

Thus, the vertically moving mechanism 20 is configured to vertically move the transported object 6 suspended and supported by the support mechanism 19 between the transport position and the transfer position which is lower than the transport position, by spooling and feeding out the spool belts 24*a*.

Figure 5:
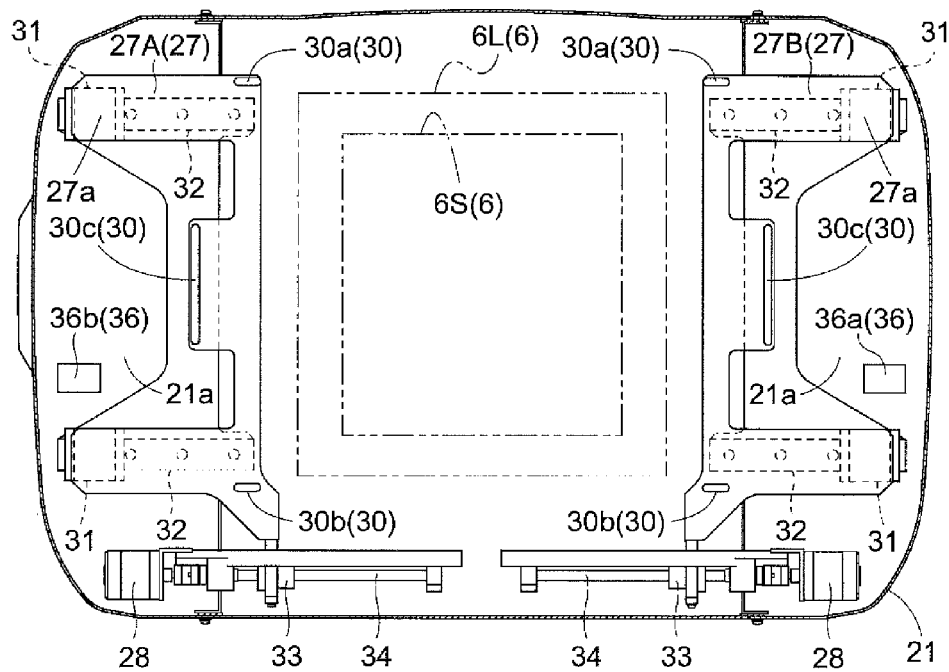
FIG. 5 is a plan view of a principal portion of the ceiling transport vehicle in which the distance between the pair of fall prevention members is adjusted to the distance for retraction.
Figure 6:
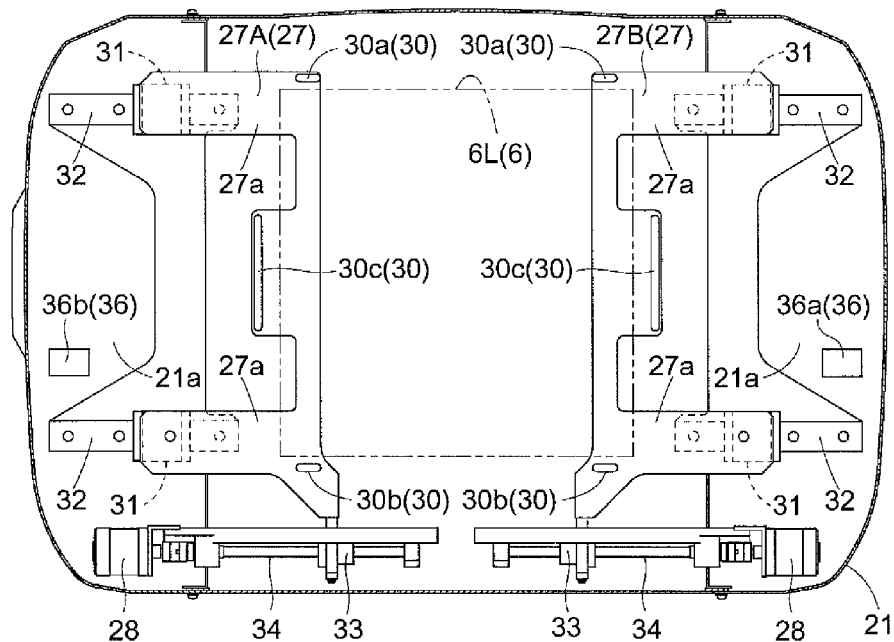
FIG. 6 is a plan view of a principal portion of the ceiling transport vehicle in which the distance between the pair of fall prevention members is adjusted to the distance for the larger transported object.
Figure 7:
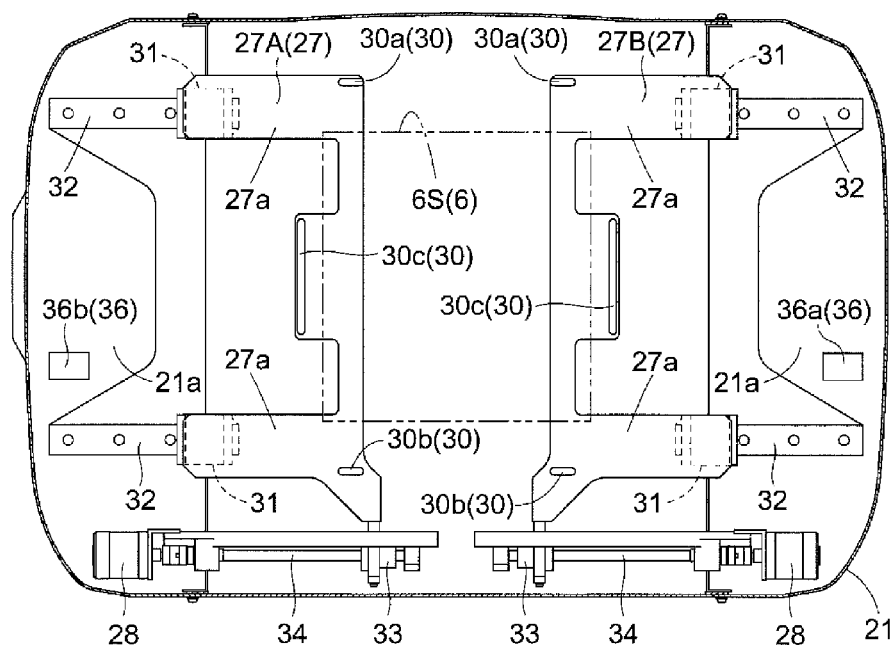
FIG. 7 is a plan view of a principal portion of the ceiling transport vehicle in which the distance between the pair of fall prevention members is adjusted to the distance for the smaller transported object.
Figure 8:
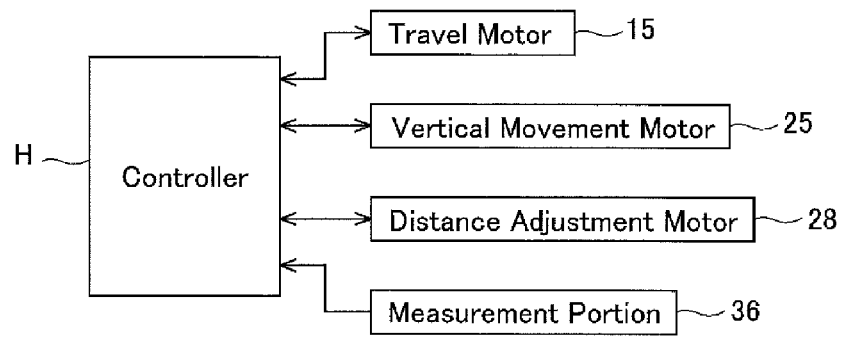
FIG. 8 is a control block diagram.

The fall prevention mechanism 22 includes, at a level below the transported object 6 in the transport position, a pair of fall prevention members 27 which are lined up, or spaced apart, horizontally, and a pair of distance adjustment motors 28 that function as a distance adjustment actuator portion for adjusting the distance, or gap, between the pair of fall prevention members 27 in the lateral direction (spaced-apart direction) along which the pair of fall prevention members 27 are lined up or spaced apart from each other. As shown in FIGS. 5-7, each fall prevention member 27 is supported by a support portion 21*a* in the cover portion 21.

The pair of fall prevention members 27 are configured such that the distance between the pair of fall prevention members 27 can be adjusted as the pair of fall prevention members 27 are linearly moved in mutually opposite directions, or away from and toward each other, along the lateral direction. The fall prevention mechanism 22 adjusts the distance, or the gap, between the pair of fall prevention members 27 by actuating the pair of distance adjustment motors 28. The target distances for adjustment include a distance for retraction (see FIGS. 2 and 5) which is greater than the lateral width (width in the spaced-apart direction) of the larger transported object 6L, a distance for the larger transported object (see FIGS. 3 and 6) which is less than the distance for retraction and which corresponds to the lateral width of the larger transported object 6L, and a distance for the smaller transported object (see FIGS. 4 and 7) which is less than the distance for the larger transported object and which corresponds to the lateral width of the smaller transported object 6S. And the fall prevention mechanism 22 is configured to be able to adjust the distance between the pair of fall prevention members 27 to any of the distance for retraction, the distance for the larger transported object, and the distance for the smaller transported object.

Each of the pair of fall prevention members 27 includes a plate-shaped member which is installed in the vertical movement support portion 13 such that the plate-shaped member assumes a horizontal attitude (i.e., the surface of the plate-shaped member is parallel to the horizontal plane). In addition, each of the pair of fall prevention members 27 is formed such that, in plan view, a portion is cut out from a rectangular plate-shaped member such as to have a pair of protruding portions 27*a* with one at each end portion in the fore and aft direction and with each protruding outwardly in the lateral direction (i.e., away from the other of the pair of fall prevention members 27). Thus, efforts are made to reduce weight of the pair of fall prevention members 27 by forming them to have a shape with cut-out portions.

Each of the pair of fall prevention members 27 is provided with a plurality of restriction members 30 for restricting movement of the transported object in horizontal directions. And these restriction members 30 prevent the transported object 6 in the transport position from moving beyond a predetermined range in the fore and aft direction and the lateral direction. The upper end of each restriction member 30 is located above the lower end of the smaller transported object 6S in the transport position. Incidentally, the height of the supported member 8 of the smaller transported object 6S in the transport position is the same as the height of the supported member 8 of the larger transported object 6L in the transport position; thus, the lower end of the smaller transported object 6S in the transport position is located above the lower end of the larger transported object 6L in the transport position. Thus, the upper end of each restriction member 30 located above the lower end of the smaller transported object 6S in the transport position is located above the lower end of the larger transported object 6L in the transport position.

Each of the pair of fall prevention members 27 has, as the restriction members 30, a front side restriction member 30*b* located on the first fore and aft direction side (front side) with respect to the transported object 6 in the transport position, a back side restriction member 30*a* located on the second fore and aft direction side (back side) with respect to the transported object 6 in the transport position, and a lateral side restriction member 30*c* located outwardly, in the lateral direction, of the transported object 6 in the transport position. Note that "outwardly, in the lateral direction, of the transported object 6 in the transport position" means "either on the first lateral direction side or on the second lateral direction side with respect to the transported object 6 in the transport position".

Of the pair of fall prevention members 27, the fall prevention member 27 located on the first lateral direction side (referred to hereafter as the first fall prevention member 27A) is provided with the lateral side restriction member 30*c* such that it is located on the first lateral direction side with respect to the transported object 6 in the transport position. And of the pair of fall prevention members 27, the fall prevention member 27 located on the second lateral direction side (referred to hereafter as the second fall prevention member 27B) is provided with the lateral side restriction member 30c such that it is located on the second lateral direction side with respect to the transported object 6 in the transport position.

With the pair of fall prevention members 27 adjusted to the distance for retraction, the distance between the two front side restriction members 30b of the pair of fall prevention members 27, the distance between the two back side restriction members 30a, and the distance between the two lateral side restriction member 30c are set to be greater than the width of the larger transported object 6L in the lateral direction.

With the pair of fall prevention members 27 adjusted to the distance for the larger transported object, the distance between the two front side restriction members 30b of the pair of fall prevention members 27 and the distance between the two back side restriction members 30a are set to be less than the width of the larger transported object 6L in the lateral direction whereas the distance between the two lateral side restriction member 30c of the pair of fall prevention members 27 is set to be greater than the width of the larger transported object 6L in the lateral direction.

With the pair of fall prevention members 27 adjusted to the distance for the smaller transported object, the distance between the two front side restriction members 30b of the pair of fall prevention members 27 and the distance between the two back side restriction members 30a are set to be less than the width of the smaller transported object 6S in the lateral direction whereas the distance between the two lateral side restriction member 30c of the pair of fall prevention members 27 is set to be greater than the width of the smaller transported object 6S in the lateral direction and less than the width of the larger transported object 6L in the lateral direction.

Connected to an outward end portion, in the lateral direction, of each of the pair of fall prevention members 27 is a guided member 31.

To describe in more detail, the fall prevention mechanism 22 is provided with one or more pairs of guided members 31. One of a pair of guided members 31 is connected to the undersurface of the protruding portion 27a of the first fall prevention member 27A while the other of the pair of guided members 31 is connected to the undersurface of the protruding portion 27a of the second fall prevention member 27B so that the pair of guided members 31 are connected to the pair of fall prevention members 27. And in the present embodiment, one guided member 31 is connected to each of the pair of protruding portions 27a located at the ends, in the fore and aft direction, of each fall prevention member 27; thus, two pairs of guided members 31 are provided to the fall prevention mechanism 22.

A guide member 32 is provided in the support portion 21a of the cover portion 21 for guiding each of the pair of guided members 31 individually in the lateral direction. Each pair of guide members 32 consists of a guide member 32 for guiding one of the pair of guided members 31 and a guide member 32 for guiding the other of the pair of guided members 31. In the present embodiment, two pairs of guide members 32 are provided for the two pairs of guided members 31 with each pair of guide members 32 corresponding to the associated pair of guided members 31.

And as shown in FIG. 5, the guide members 32 for guiding the guided members 31 connected to the first fall prevention member 27A are located outwardly, in the lateral direction (first lateral direction side), of the inner ends (i.e., on the second lateral direction side) of the first fall prevention member 27A when in the distance for retraction. And the guide members 32 for guiding the guided members 31 connected to the second fall prevention member 27B are located outwardly, in the lateral direction (second lateral direction side), of the inner ends (i.e., on the first lateral direction side) of the second fall prevention member 27B when in the distance for retraction.

A moving member 33 is connected to the end portion on the first fore and aft direction side in each of the pair of fall prevention members 27 individually.

To describe in more detail, a pair of moving members 33 consists of a moving member 33 connected to one of the pair of fall prevention members 27 and a moving member 33 connected to the other of the pair of fall prevention members 27. And the pair of moving members 33 are connected to the pair of fall prevention members 27 by connecting one of the pair of moving members 33 to the end portion, on the first fore and aft direction side, of the first fall prevention member 27A such that it projects from the first fall prevention member 27A toward the first fore and aft direction side, and by connecting the other of the pair of moving members 33 to the end portion, on the first fore and aft direction side, of the second fall prevention member 27B such that it projects from the second fall prevention member 27B toward the first fore and aft direction side.

The distance adjustment motors 28 are located, with respect to the pair of fall prevention members 27, on the first fore and aft direction side (one side in the fore and aft direction), which is the side the moving members 33 are located. In addition, ball screws 34, each of which is driven and rotated by the corresponding distance adjustment motor 28, and each of which the corresponding moving member 33 meshes with, are provided on the first fore and aft direction side of the pair of fall prevention member 27. A pair of distance adjustment motors 28 and a pair of the ball screws 34 are provided for the pair of moving members 33 such that each one of the pair of distance adjustment motors 28 and each one of the pair of the ball screws 34 are provided for the corresponding one of the pair of moving members 33. And the distance between the pair of fall prevention members 27 are adjusted by moving the pair of moving members 33 in mutually opposite directions, or away from or toward each other, along the lateral direction by drivingly rotating each of the pair of ball screws 34 by the corresponding one of the pair of distance adjustment motors 28.

Thus, the ceiling transport vehicle 1 includes the support mechanism 19, the vertically moving mechanism 20, the pair of fall prevention members 27, the distance adjustment motors 28, the travel portion 12, and the travel motor 15. And the travel portion 12 is the movable member which supports the support mechanism 19, the vertically moving mechanism 20, the pair of fall prevention members 27, and the distance adjustment motors 28. In addition, the travel motor 15 is the transport driving member for moving the movable member along the transporting path with the transported object 6 located in the transport position.

In addition, the ceiling transport vehicle 1 is provided with a controller H which controls the operation of the ceiling transport vehicle 1, and a measurement portion 36 which performs measurement to obtain information on the width, in the lateral direction, of the transported object 6 located in the transport position. Here, the meaning of the expression "information on the width, in the lateral direction, of the transported object" is not limited to the information on the width, in the lateral direction, of the transported object concerned, but instead includes, information on any physical quantity that is related to the width, in the lateral direction, of the transported object (i.e., any physical quantity that changes depending on the width). In the present embodiment, the larger transported object 6L having a larger width, in the lateral direction, than the width, in the lateral direction, of the smaller transported object 6S is formed to be larger in the vertical direction, or have a greater vertical dimension, than the smaller transported object 6S. Thus, measurement taken by the measurement portion 36 provides information on the vertical dimension (vertical width) of the transported object 6, which changes depending on the width, in the lateral direction, of the transported object 6.

The controller H is configured to control the operation of the travel portion 12 (travel motor 15) to cause the ceiling transport vehicle 1 to travel to a travel stop position which is determined in advance with respect to a support platform 4, etc. In addition, the controller H is configured to control operations of the support mechanism 19 and the vertically moving mechanism 20 (vertical movement motor 25) to vertically move and transfer the transported object 6 between a transport position and a transfer position. In addition, the controller H is configured to control the operations of the distance adjustment motors 28 to adjust the distance between the pair of fall prevention members 27. The target distances for adjustment include a distance for retraction, a distance for the larger transported object, and a distance for the smaller transported object.

The measurement portion 36 includes an optical or light emitter 36a which emits detection light along the lateral direction, and a light receiver 36b which receives the detection light emitted by the light emitter 36a.

The light emitter 36a is so provided that it emits detection light at a height such that the detection light is blocked by the larger transported object 6L (the lower end portion of the larger transported object 6L in the present example) in the transport position, and such that the detection light is not blocked by the smaller transported object 6S in the transport position. In other words, the height at which the detection light is emitted by the light emitter 36a is higher than the lower end of the larger transported object 6L in the transport position, and is lower than the lower end of the smaller transported object 6S in the transport position. The light receiver 36b is provided at the same height as the light emitter 36a. Thus, the measurement portion 36 in the present embodiment takes measurement for obtaining information on the vertical width (i.e., height) of the transported object 6 located in the transport position, which is an example of the information on the width in the lateral direction. In this process, as information on the vertical width, or the height, of the transported object 6, information is obtained which indicates if the vertical dimension of the transported object 6 is either a large dimension having a dimension that would block the detection light, or a small dimension having a dimension that would not block the detection light. And based on the obtained information, the transported object 6 is determined to be the larger transported object 6L if the vertical dimension of the transported object 6 is a large dimension with such dimension as to block the detection light, and the transported object 6 is determined to be the smaller transported object 6S if the vertical dimension of the transported object 6 is a small dimension with such dimension as to not block the detection light. In other words, it is determined, based on the obtained information on the vertical dimension of the transported object 6, if the width, in the lateral direction, of the transported object 6 is the width of the larger transported object 6L, or is the width of the smaller transported object 6S.

The controller H is configured to receive transport information from an external controller (not shown). This transport information includes transported object information which is information indicating the size of the transported object 6, transfer information indicating the support platform 4 that is the target of transfer which the transported object 6 is received from or delivered to, and positional displacement information indicating the amount of tilting of the support platform 4 with respect to a vertical axis relative to the travel path as well as the amount of displacement, in the lateral direction, of the support platform 4 relative to the travel path.

The controller H is configured to control the operation of the ceiling transport vehicle 1, based on the transport information from the external controller, to perform a receiving operation for receiving a transported object 6 from the support platform 4 of a processing device 3, and a delivering operation for delivering a transported object 6 to the support platform 4 of a processing device 3.

Figure 9:
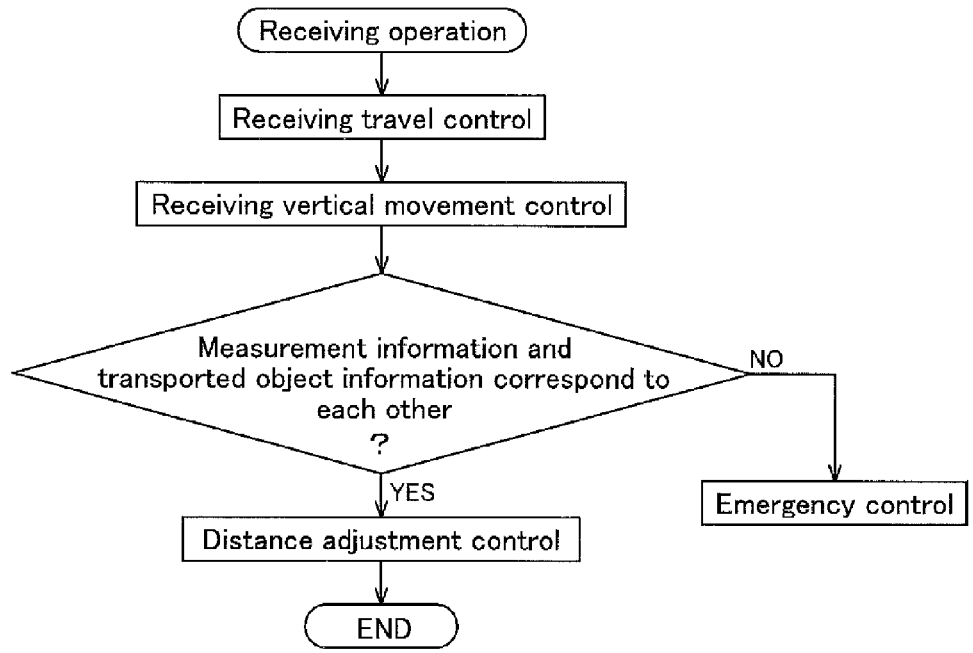
FIG. 9 is a flow chart for a receiving operation.

As shown in FIG. 9, in the receiving operation, the controller H performs receiving travel control in which the operation of the travel portion 12 is controlled based on the transfer information to stop the ceiling transport vehicle 1, that is not supporting a transported object 6, at a travel stop position set for the target support platform 4, and subsequently, performs receiving vertical movement control in which the operation of the vertical movement support portion 13 is controlled to pick up (i.e. to lift) the transported object 6 located in the transfer position on the support platform 4 to the transport position. Note that, when performing the receiving travel control and the receiving vertical movement control, the distance between the pair of fall prevention members 27 is switched, or changed, to the distance for retraction.

To describe in more detail about this receiving vertical movement operation (operation performed in the receiving vertical movement control), in the receiving vertical movement operation, the positioning mechanism is firstly operated based on the positional displacement information, with the ceiling transport vehicle 1 stopped at a travel stop position, to adjust the tilting and position, in the lateral direction, of the support mechanism 19 with respect to the support platform 4. Secondly, after feeding out the spool belts 24a by the length corresponding to, or appropriate for, the size of the transported object 6 based on the transported object information, the transported object 6 in the transfer position is received by the support mechanism 19, after which the spool belts 24a are spooled to lift the transported object 6 from the transfer position to the transport position.

And with the ceiling transport vehicle 1 stopped at the travel stop position and with the transported object 6 located in the transport position, the measurement portion 36 performs measurement to obtain the size of the transported object 6. And if the size of the transported object 6 indicated by the transported object information corresponds to, or consistent with, the size of the transported object 6 according to the measurement information from the measurement portion 36 (width in the lateral direction), distance adjustment control is performed, based on the measurement information, in which the distance between the pair of fall prevention members 27 is adjusted from the distance for retraction to the distance for the larger transported object, or the distance for the smaller transported object. And if the size of the transported object 6 indicated by the transported object information does not correspond to, or is not consistent with, the size of the transported object 6 based on, or according to, the measurement information from the measurement portion 36 (width in the lateral direction), predetermined emergency control is performed. In this emergency control, the receiving operation is stopped during the operation and a warning device (not shown) is operated.

As shown in FIG. 10, in the delivering operation, the controller H performs delivery travel control in which the operation of the travel portion 12 is controlled, based on transfer information, to cause the ceiling transport vehicle 1 that supports a transported object 6 to stop at the travel stop position set for the target support platform 4. Note that when performing the delivery travel control, the transported object 6 is located in the transport position and the distance between the pair of fall prevention members 27 is switched, or changed, to the distance corresponding to, or appropriate for, the size of the transported object 6 (i.e., the distance for the larger transported object or the distance for the smaller transported object).

And with the ceiling transport vehicle 1 stopped at the travel stop position and with the transported object 6 located in the transport position, the measurement portion 36 performs measurement to obtain the size of the transported object 6. And if the size of the transported object 6 indicated by the transported object information corresponds to, or consistent with, the size of the transported object 6 according to the measurement information from the measurement portion 36 (width in the lateral direction), transfer adjustment control is performed in which the distance between the pair of fall prevention members 27 is adjusted from the distance for the larger transported object or the distance for the smaller transported object to the distance for retraction, after which delivery vertical movement control is performed in which the operation of the vertical movement support portion 13 is controlled to lower the transported object 6 supported in the transport position to the transfer position on the support platform 4. And if the size of the transported object 6 indicated by the transported object information does not correspond to, or is not consistent with, the size of the transported object 6 based on, or according to, the measurement information from the measurement portion 36 (width in the lateral direction), predetermined emergency control is performed. In this emergency control, the delivery operation is stopped during the operation and a warning device (not shown) is operated. Detailed description of the delivery vertical movement operation is omitted here since the delivery vertical movement operation is different from the receiving vertical movement control only in the way the transported object 6 is supported or carried by the support mechanism 19.

The ceiling transport vehicle 1 is configured to support the pair of fall prevention members 27 such that they can move linearly along the lateral direction by means of the guided members 31 and the guide members 32 so that the distance between the pair of fall prevention members 27 can be adjusted by causing the pair of fall prevention members 27 to move linearly in the opposite directions, or away from or toward each other, along the spaced-apart direction along which the pair of fall prevention members 27 are lined up or spaced apart from each other. Thus, the distance between the pair of fall prevention members 27 can be adjusted to any of the distance for retraction, the distance for the larger transported object, and the distance for the smaller transported object without having to cause the pair of fall prevention members 27 to move in the fore and aft direction.

[Alternative Embodiments]

(1) In the embodiment described above, the distance between the pair of fall prevention members 27 is adjusted based on the measurement information from the measurement portion 36 provided to the transport device; however, the distance between the pair of fall prevention members 27 may be adjusted based on the transported object information received from an external controller.

(2) In the embodiment described above, the measurement portion 36 is configured to make use of, or include, a light emitter 36a and a light receiver 36b; however, the measurement portion 36 may be configured to make use of, or include, other sensors, such as a limit switch.

Also, when the measurement portion 36 is configured to make use of, or include, a light emitter 36a and a light receiver 36b, the light emitter 36a may be configured to emit detection light along the vertical direction and at such a position that the detection light is blocked by the larger transported object 6L (for example, by an end, in the lateral direction, of the larger transported object 6L) in the transport position, and the detection light is not blocked by the smaller transported object 6S in the transport position.

(3) In the embodiment described above, the measurement portion 36 is provided in the ceiling transport vehicle 1 to obtain information on the width, in the spaced-apart direction, of the transported object 6; however, a tag, such as an ID tag and a bar code, may be affixed to the transported object 6 with the tag storing or displaying information indicating the lateral width of the transported object 6 and information indicating the kind of the transported object 6, as information indicating the size information of the transported object 6. And a reading portion for reading in the size information indicated by the tag may be provided to the ceiling transport vehicle 1.

(4) In the embodiment described above, the guided members 31 are connected to outward end portions, in the spaced-apart direction, of the fall prevention members 27; however, the locations at which the guided members 31 are connected to the fall prevention members 27 may be changed as appropriate. For example, the guided members 31 may be connected to middle portions, in the spaced-apart direction, of respective fall prevention members 27.

Also, in the embodiment described above, the moving members 33 are connected to one side ends, in the fore and aft direction, of the fall prevention members 27; however, the locations at which the moving members 33 are connected to the fall prevention members 27 may be changed as appropriate. For example, the moving members 33 may be connected to middle portions, in the fore and aft direction, of respective fall prevention members 27.

(5) In the embodiment described above, the front side restriction member 30a, the back side restriction member 30b, and the lateral side restriction members 30c are provided as the restriction members 30; however, one, some, or all, of the front side restriction member 30a, the back side restriction member 30b, and the lateral side restriction members 30c does/do not have to be provided as the restriction members 30. For example, the lateral side restriction members 30c may not be provided as the restriction members 30 if the way the transported object 6 is supported by the support mechanism 19 makes it difficult for the transported object 6 to fall in the lateral direction.

(6) In the embodiment described above, the distance adjustment actuator portion is configured to make use of a pair of distance adjustment motors 28; however, the distance adjustment actuator portion is configured to make use of a single distance adjustment motor 28. In that case, the threads on the pair of ball screws 34 may be threaded in opposite directions and the pair of ball screws 34 may be connected to each other so as to be rotated in unison so that these connected pair of ball screws 34 can be driven and rotated by the single distance adjustment motor 28.

(7) In the embodiment described above, each of the pair of fall prevention members 27 is formed such that, in plan view, a portion is cut out from a rectangular plate-shaped member such as to have a pair of protruding portions 27a with one at each end portion in the fore and aft direction and with each protruding outwardly in the lateral direction; however, each of the pair of fall prevention members 27 may be formed to be rectangular in shape in plan view (i.e., it does not have to have a shape with a portion cut out from a rectangle). In addition, the pair of fall prevention members 27 do not have to be formed using plate-shaped members. For example, each fall prevention member 27 may be formed with a first bar member extending in the fore and aft direction and a pair of second bar members extending from the first bar member outwardly in the lateral direction.

What is claimed is:

1. A transport device comprising:
    a support for suspending and supporting a transported object;
    a vertically moving portion for vertically moving the support to vertically move the transported object, that is suspended and supported by the support, between a transport position and a transfer position which is lower than the transport position;
    a pair of fall prevention members spaced apart from each other horizontally at locations below the transported object in the transport position;
    a distance adjustment actuator portion for adjusting a distance between the pair of fall prevention members in a spaced-apart direction along which the pair of fall prevention members are spaced apart from each other;
    a movable member for supporting the support, the vertically moving portion, the pair of fall prevention members, and the distance adjustment actuator portion; and
    a transport driving member for moving the movable member with the transported object located in the transport position;
    a controller for controlling operation of the distance adjustment actuator portion;
    wherein one of a smaller transported object and a larger transported object having a larger width in the spaced-apart direction than the smaller transported object is provided as the transported object; and
    further comprising a measurement portion for performing measurement for obtaining information on one of the width of the larger transport object in the spaced-apart direction and the width of the smaller transported object in the spaced-apart direction,
    wherein the pair of fall prevention members are configured such that the distance between the pair of fall prevention members are adjustable by causing the pair of fall prevention members to be linearly moved in mutually opposite directions along the spaced-apart direction,
    wherein the distance adjustment actuator portion is configured to be able to adjust the distance between the pair of fall prevention members to any of:
        a distance for retraction greater than the width of the larger transported object in the spaced-apart direction;
        a distance for the larger transported object which is less than the distance for retraction and which corresponds to the width of the larger transported object in the spaced-apart direction; and
        a distance for the smaller transported object which is less than the distance for the larger transported object and which corresponds to a width of the smaller transported object in the spaced-apart direction, and
    wherein the controller is configured to control operation of the distance adjustment actuator portion based on the measurement information from the measurement portion to adjust the distance between the pair of fall prevention members from the distance for retraction to the distance for the larger transported object or to the distance for the smaller transported object.

2. The transport device as defined in claim 1, wherein the larger transported object is formed to be larger than the smaller transported object in a vertical direction,
    wherein the measurement portion includes an optical light emitter for emitting detection light along the spaced-apart direction, and a light receiver for receiving the detection light emitted by the light emitter,
    wherein the light emitter emits the detection light at such a height that the detection light is blocked by the larger transported object in the transport position and that the detection light is not blocked by the smaller transported object in the transport position.

3. The transport device as defined in claim 1, wherein the controller is configured to receive transported object information which indicates a size of the transported object, from an external controller, and the controller is configured to perform a predetermined emergency control if the transported object information does not correspond to the width of the transported object in the spaced-apart direction according to the measurement information from the measurement portion.

4. The transport device as defined in claim 1, wherein the larger transported object is formed to be larger than the smaller transported object in a vertical direction, wherein each of the pair of fall prevention members is provided with restriction members for restricting movement of the transported object along horizontal directions,
    wherein an upper end of each of the restriction members is located above a lower end of the smaller transported object in the transport position, and
    wherein the restriction members include a front side restriction member located on a front side of the transported object in the transport position, along a fore and aft direction which is perpendicular to the spaced-apart direction, a back side restriction member located on a back side, along the fore and aft direction, of the transported object in the transport position, and a lateral side restriction member located outwardly, along the spaced-apart direction, of the transported object in the transport position.

5. The transport device as defined in claim 1, wherein
    a moving member is connected to each of the pair of fall prevention members wherein each of the moving members is connected to one end portion, along a fore and aft direction, of corresponding one of the pair of fall prevention members, with the fore and aft direction being perpendicular to the spaced-apart direction, and
    wherein the distance adjustment actuator portion is provided on one side, along the fore and aft direction, in which the moving members are located with respect to the pair of fall prevention members, and is configured to move the moving member connected to one of the pair of fall prevention members and the moving member connected to the other of the pair of fall prevention members, in mutually opposite directions along the spaced-apart direction.

6. The transport device as defined in claim 1, wherein
a guided member is connected to each of the pair of fall prevention members wherein each of the guided members is connected to an outward end portion, in the spaced-apart direction, of the corresponding one of the pair of fall prevention members, and
wherein there are provided a guide member for guiding, along the spaced-apart direction, the guided member connected to one of the pair of fall prevention members, and a guide member for guiding, along the spaced-apart direction, the guided member connected to the other of the pair of fall prevention members.

7. A transport device comprising:
a support for suspending and supporting a transported object;
a vertically moving portion for vertically moving the support to vertically move the transported object, that is suspended and supported by the support, between a transport position and a transfer position which is lower than the transport position;
a pair of fall prevention members spaced apart from each other horizontally at locations below the transported object in the transport position;
a distance adjustment actuator portion for adjusting a distance between the pair of fall prevention members in a spaced-apart direction along which the pair of fall prevention members are spaced apart from each other;
a movable member for supporting the support, the vertically moving portion, the pair of fall prevention members, and the distance adjustment actuator portion; and
a transport driving member for moving the movable member with the transported object located in the transport position;
wherein one of a smaller transported object and a larger transported object having a larger width in the spaced-apart direction than the smaller transported object is provided as the transported object,
wherein the pair of fall prevention members are configured such that the distance between the pair of fall prevention members are adjustable by causing the pair of fall prevention members to be linearly moved in mutually opposite directions along the spaced-apart direction,
wherein the distance adjustment actuator portion is configured to be able to adjust the distance between the pair of fall prevention members to any of:
 a distance for retraction greater than the width of the larger transported object in the spaced-apart direction;
 a distance for the larger transported object which is less than the distance for retraction and which corresponds to the width of the larger transported object in the spaced-apart direction; and
 a distance for the smaller transported object which is less than the distance for the larger transported object and which corresponds to a width of the smaller transported object in the spaced-apart direction,
wherein the larger transported object is formed to be larger than the smaller transported object in a vertical direction, wherein each of the pair of fall prevention members is provided with restriction members for restricting movement of the transported object along horizontal directions,
wherein an upper end of each of the restriction members is located above a lower end of the smaller transported object in the transport position,
wherein the restriction members include a front side restriction member located on a front side of the transported object in the transport position, along a fore and aft direction which is perpendicular to the spaced-apart direction, a back side restriction member located on a back side, along the fore and aft direction, of the transported object in the transport position, and a lateral side restriction member located outwardly, along the spaced-apart direction, of the transported object in the transport position, and
wherein, with the distance between the pair of fall prevention members adjusted to the distance for the smaller transported object, a distance between the lateral side restriction member provided in one of the pair of fall prevention members and the lateral side restriction member provided in the other of the pair of fall prevention members is set to be greater than the width of the smaller transported object in the spaced-apart direction and less than the width of the larger transported object in the spaced-apart direction.

* * * * *